(12) United States Patent
Owa

(10) Patent No.: US 7,948,604 B2
(45) Date of Patent: May 24, 2011

(54) EXPOSURE APPARATUS AND METHOD FOR PRODUCING DEVICE

(75) Inventor: Soichi Owa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/144,827

(22) Filed: Jun. 6, 2005

(65) Prior Publication Data
US 2005/0219490 A1    Oct. 6, 2005

Related U.S. Application Data

(63) Continuation of application No. PCT/JP03/15407, filed on Dec. 2, 2003.

(30) Foreign Application Priority Data

Dec. 10, 2002 (JP) ................................. 2002-357961
Jan. 9, 2003 (JP) ................................. 2003-002820
Feb. 26, 2003 (JP) ................................. 2003-049367

(51) Int. Cl.
*G03B 27/52* (2006.01)
*G03B 27/42* (2006.01)

(52) U.S. Cl. .......................................... 355/30; 355/53

(58) Field of Classification Search ................ 430/5, 31, 430/311; 355/30, 67, 53, 55; 250/548
See application file for complete search history.

(56) References Cited

U.S. PATENT DOCUMENTS

| 4,346,164 | A |   | 8/1982  | Tabarelli et al.         |
|-----------|---|---|---------|--------------------------|
| 4,480,910 | A | * | 11/1984 | Takanashi et al. 355/30  |
| 4,509,852 | A | * | 4/1985  | Tabarelli et al. 355/30  |
| 4,935,151 | A | * | 6/1990  | Do 210/739               |
| 5,610,683 | A | * | 3/1997  | Takahashi 355/53         |
| 5,715,039 | A |   | 2/1998  | Fukuda et al.            |
| 5,762,684 | A |   | 6/1998  | Hayashi et al.           |
| 5,825,043 | A |   | 10/1998 | Suwa 356/399             |
| 5,938,922 | A |   | 8/1999  | Fulk, Jr. et al.         |
| 5,993,518 | A | * | 11/1999 | Tateyama 95/261          |
| 6,033,475 | A |   | 3/2000  | Hasebe et al.            |
| 6,126,725 | A |   | 10/2000 | Tateyama                 |
| 6,379,796 | B1| * | 4/2002  | Uenishi et al. 428/398   |

(Continued)

FOREIGN PATENT DOCUMENTS

DE           221 563 A1        4/1985

(Continued)

OTHER PUBLICATIONS

Emerging Lithographic Technologies V1, Proceedings of SPIE, vol. 4688 (2002), "Semiconductor Foundry, Lithography, and Partners", B.J. Lin, pp. 11-24.

(Continued)

*Primary Examiner* — Hung Henry Nguyen
(74) *Attorney, Agent, or Firm* — Oliff & Berridge, PLC

(57) ABSTRACT

An exposure apparatus, wherein exposure is carried out while filling a space between a projection optical system and a substrate with a liquid, enables to suppress deterioration of a pattern image caused by any bubble in the liquid. The exposure apparatus includes a liquid supply unite 1 which fills at least a part of the space between the projection optical system and the substrate with a liquid 50, and exposes the substrate by projecting an image of a pattern onto the substrate via the projection optical system. The liquid supply unite 1 includes a degassing unit 21 which suppresses the generation of the bubble in the liquid 50.

56 Claims, 9 Drawing Sheets

U.S. PATENT DOCUMENTS

| | | | |
|---|---|---|---|
| 6,781,670 B2 * | 8/2004 | Krautschik | 355/53 |
| 6,809,794 B1 | 10/2004 | Sewell | |
| 6,867,844 B2 * | 3/2005 | Vogel et al. | 355/30 |
| 6,954,256 B2 * | 10/2005 | Flagello et al. | 355/53 |
| 2002/0163629 A1 | 11/2002 | Switkes et al. | |
| 2003/0030916 A1 | 2/2003 | Suenaga | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 * | 12/2004 | Vogel et al. | 355/30 |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 * | 12/2004 | Nakano | 355/30 |
| 2005/0007470 A1 | 1/2005 | Kimura et al. | |
| 2005/0024609 A1 * | 2/2005 | De Smit et al. | 355/77 |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0046934 A1 | 3/2005 | Ho et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0074704 A1 | 4/2005 | Endo et al. | |
| 2005/0084794 A1 | 4/2005 | Meagley et al. | |
| 2005/0094116 A1 | 5/2005 | Flagello et al. | |
| 2005/0100745 A1 | 5/2005 | Lin et al. | |
| 2005/0106512 A1 | 5/2005 | Endo et al. | |
| 2005/0110973 A1 | 5/2005 | Streefkerk et al. | |
| 2005/0117224 A1 | 6/2005 | Shafer et al. | |
| 2005/0134817 A1 | 6/2005 | Nakamura | |
| 2005/0141098 A1 | 6/2005 | Schuster | |
| 2005/0190455 A1 | 9/2005 | Rostalski et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2006/0023187 A1 | 2/2006 | Eaton | |

FOREIGN PATENT DOCUMENTS

| | | |
|---|---|---|
| DE | 224 448 A1 | 7/1985 |
| JP | A-57-153433 | 9/1982 |
| JP | A-58-202448 | 11/1983 |
| JP | A-59-19912 | 2/1984 |
| JP | A 62-065326 | 3/1987 |
| JP | A-62-65326 | 3/1987 |
| JP | A-63-157419 | 6/1988 |
| JP | A-4-305915 | 10/1992 |
| JP | A-04-305915 | 10/1992 |
| JP | A-04-305917 | 10/1992 |
| JP | A-4-305917 | 10/1992 |
| JP | A-05-62877 | 3/1993 |
| JP | A-5-62877 | 3/1993 |
| JP | A 06-124873 | 5/1994 |
| JP | A 06-168866 | 6/1994 |
| JP | A-6-254304 | 9/1994 |
| JP | A-07-220990 | 8/1995 |
| JP | A 07-220990 | 8/1995 |
| JP | A-8-316125 | 11/1996 |
| JP | A 10-255319 | 9/1998 |
| JP | A 10-303114 | 11/1998 |
| JP | A-10-303114 | 11/1998 |
| JP | A-10-340846 | 12/1998 |
| JP | A 10-340846 | 12/1998 |
| JP | A-11-176727 | 7/1999 |
| JP | 11319678 | * 11/1999 |
| JP | A-2000-58436 | 2/2000 |
| JP | A-2000-353663 | 12/2000 |
| WO | WO99/49504 | * 9/1999 |
| WO | WO 99/49504 A1 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, Litho Forum, Jan. 28, 2004, "Update on 193 nm immersion exposure tool", S. Owa et al., 51 pages (slides 1-51).

Nikon Corporation, Immersion Lithography Workshop, Dec. 11, 2002, 24 pages (slides 1-24).

Nikon Corporation, Immersion Workshop, Jan. 27, 2004, "Update on 193 nm immersion exposure tool", S. Owa et al., 38 pages (slides 1-38).

Nikon Corporation, 3$^{rd}$ 157 nm symposium, Sep. 4, 2002, "Nikon F2 Exposure Tool", Soichi Owa et al., 25 pages (slides 1-25).

Optical Microlithography XVI, Proceedings of SPIE vol. 5040 (2003), "Immersion lithography; its potential performance and issues", Soichi Owa et al., pp. 724-733.

Nikon Corporation, NGL Workshop, Jul. 10, 2003, :Potential performance and feasibility of immersion lithography, Soichi Owa et al., 33 pages, slides 1-33.

"Hollow Fiber Membrane Degassing Module: SEPAREL (trade name)", Dainippon Ink and Chemicals, Incorporated, 2001 [on line], [retrieved on May 31, 2006]. Retrieved from the internet <URL:http://www.dic.co.jp/eng/products/memb/index.html>.

"SEPAREL (trade name) EF Series", Dainippon Ink and Chemicals, Incorporated, 2001, [on line], [retrieved on Apr. 24, 2006]. Retrieved from the internet <URL:http://www.dic.co.jp/products/memb/ef.html>.

"Gas-dissolving and degassing module LIQUI-CEL (trade name)" by Dainippon Ink and Chemicals, Incorporated, Apr. 24, 2001, [on line], [retrieved on Apr. 24, 2006]. Retrieved from the internet <URL:http://www.celgard.co.jp/CKKFiles/products.html>.
Apr. 5, 2007 Office Action in U.S. Appl. No. 11/399,595.
Dec. 31, 2007 Notice of Allowance in U.S. Appl. No. 11/399,595.
Apr. 30, 2008 Office Action in U.S. Appl. No. 11/399,595.
Oct. 31, 2008 Office Action in U.S. Appl. No. 11/399,595.
May 12, 2009 Office Action in U.S. Appl. No. 11/399,595.
Jan. 28, 2010 Office Action in U.S. Appl. No. 11/399,595.
Dec. 15, 2009 Office Action in Japanese Application No. 2003-410471, with translation.
Apr. 23, 2010 Office Action in Japanese Application No. 2003-410471, with translation.
Jan. 12, 2007 Office Action in Chinese Application No. 200380105396.6, with translation.
Oct. 10, 2008 Office Action in Chinese Application No. 2007101383468, with translation.
Mar. 20, 2009 Office Action in Chinese Application No. 2007101383468, with translation.
Mar. 31, 2010 Notice of Examination Opinion in Taiwan Application No. 092134802, with translation.
March 30, 2004 International Search Report in International Application No. PCT/JP03/15407, with translation.
March 12, 2008 Supplementary European Search Report in European Application No. 03812697.5.
May 4, 2009 Danish Search and Examination Report in Singapore Application No. 200704276-5.
October 25, 2010 Office Action in U.S. Appl. No. 11/399,595.

* cited by examiner

EXPOSURE APPARATUS AND METHOD FOR PRODUCING DEVICE

CROSS-REFERENCE

This application is a Continuation Application of International Application No. PCT/JP03/015407 which was filed on Dec. 2, 2003 claiming the conventional priority of Japanese patent Application No. 2002-357961 filed on Dec. 10, 2002, No. 2003-002820 filed on Jan. 9, 2003, and No. 2003-049367 filed on Feb. 26, 2003.

BACKGROUND OF THE INVENTION

1. Field of the Invention

The present invention relates to an exposure apparatus for exposing a substrate with a pattern image projected by a projection optical system in a state in which at least a part of a space between the projection optical system and the substrate is filled with a liquid. The present invention also relates to a method for producing a device based on the use of the exposure apparatus.

2. Description of the Related Art

Semiconductor devices and liquid crystal display devices are produced by the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus $\delta$ are represented by the following expressions respectively.

$$R = k_1 \cdot \lambda/NA \qquad (1)$$

$$\delta = \pm k_2 \cdot \lambda/NA^2 \qquad (2)$$

In the expressions, $\lambda$ represents the exposure wavelength, NA represents the numerical aperture of the projection optical system, and $k_1$ and $k_2$ represent the process coefficients. According to the expressions (1) and (2), the following fact is appreciated. That is, when the exposure wavelength $\lambda$ is shortened and the numerical aperture NA is increased in order to enhance the resolution R, then the depth of focus $\delta$ is narrowed.

If the depth of focus $\delta$ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to utilize the fact that the wavelength of the exposure light beam in the liquid is 1/n as compared with that in the air (n represents the refractive index of the liquid, which is about 1.2 to 1.6 in ordinary cases) so that the resolution is improved and the depth of focus is magnified about n times.

Any bubble sometimes adheres to the lower surface of the projection optical system and/or the substrate surface in the state in which the space between the lower surface of the projection optical system and the substrate surface is filled with the liquid. In this way, for example, if the bubble exists in the liquid disposed between the projection optical system and the substrate during the exposure, the following phenomenon arises. That is, for example, the light beam, which is radiated to form the image on the substrate, does not arrive at the substrate surface, and/or the light beam, which is radiated to form the image on the substrate, does not arrive at a desired position on the substrate. As a result, the pattern image, which is to be formed on the substrate, is deteriorated.

SUMMARY OF THE INVENTION

The present invention has been made taking the foregoing circumstances into consideration, an object of which is to provide an exposure apparatus which makes it possible to suppress the deterioration of a pattern image which would be otherwise caused by any bubble in a liquid when the exposure process is performed while filling a space between a projection optical system and a substrate with the liquid, and a method for producing a device based on the use of the exposure apparatus.

In order to achieve the object as described above, the present invention adopts the following constructions.

According to a first aspect of the present invention, there is provided an exposure apparatus which exposes a substrate with an image of a predetermined pattern, the exposure apparatus comprising:

a projection optical system which projects the image of the predetermined pattern onto the substrate;

a liquid supply unit which supplies a liquid to a space between the projection optical system and the substrate; and a gas-removing unit which removes a gas component contained in the liquid which is to be supplied to the space between the projection optical system and the substrate.

In the exposure apparatus of the present invention, the liquid, from which the gas component has been sufficiently removed, can be supplied to the space between the projection optical system and the substrate, because the exposure apparatus of the present invention is provided with the gas-removing unit which removes the gas component from the liquid. Further, the generation of the bubble is suppressed not only in the liquid existing between the projection optical system and the substrate (in the optical path for the exposure light beam) but also in the liquid existing in the liquid flow passage running from the gas-removing unit to the space between the projection optical system and the substrate. The gas-removing unit removes the gas component from the liquid so that an air concentration in the liquid is desirably not more than 0.016 cm³/cm³. Those usable as the gas-removing unit include a heating unit, a pressure-reducing unit, a degassing membrane, and a combination thereof. The gas-removing unit may be arranged in the liquid supply unit or outside the liquid supply unit. Alternatively, the gas-removing unit may be arranged outside a chamber of the exposure apparatus.

The liquid supply unit may include a plurality of supply nozzles which supply the liquid to the space between the projection optical system and the substrate, and a plurality of recovery nozzles which recover the liquid supplied to the space between the projection optical system and the substrate. When the plurality of nozzles are used, it is possible to uniformly supply the liquid to the projection area. The exposure apparatus may further comprise a stage which is movable while placing the substrate thereon. The exposure may be performed during a period in which the stage moves the substrate with respect to the image projected from the projection optical system (scanning exposure). In this procedure, it is preferable that the supply nozzles jet the liquid in a direction of movement of the substrate, in view of the fact that the inflow resistance of the supply liquid is lowered to exert no influence on the movement of the stage.

The exposure apparatus of the present invention may further comprise a temperature-adjusting unit which adjusts a temperature of the liquid supplied from the liquid supply unit. It is desirable that the temperature-adjusting unit adjusts the temperature of the liquid so that the temperature of the liquid is a temperature in the exposure apparatus, for example, an atmospheric temperature in a chamber for accommodating the exposure apparatus. Accordingly, a temperature of the substrate may be controlled by supplying the temperature-adjusted liquid to the space between the projection optical system and the substrate.

According to a second aspect of the present invention, there is provided an exposure apparatus which exposes a substrate by projecting an image of a pattern onto the substrate with a projection optical system, the exposure apparatus comprising:

a liquid supply unit which fills, with a liquid, at least a part of the space between the projection optical system and the substrate; and a bubble-suppressing unit which suppresses generation of any bubble in the liquid.

According to the present invention, the bubble-suppressing unit is provided, which suppresses the generation of the bubbles in the liquid between the projection optical system and the substrate. Therefore, the exposure process can be performed in a state in which no bubble exists in the liquid on the optical path for the exposure light beam. Accordingly, it is possible to avoid the deterioration of the pattern image which would be otherwise caused by the bubble. It is possible to produce a device having a high pattern accuracy. For example, when the bubble-suppressing unit, which suppresses the generation of the bubble in the liquid, is provided for the liquid supply unit which supplies the liquid to the space between the projection optical system and the substrate, the liquid can be supplied to the space between the projection optical system and the substrate after sufficiently suppressing the generation of the bubble in the liquid. Therefore, no bubble is generated from the liquid which fills the space between the projection optical system and the substrate. Even if any bubble is generated in the flow passage through which the liquid flows, including, for example, the lower surface of the projection optical system and the surface of the substrate, then the liquid, in which the generation of the bubble is sufficiently suppressed, flows through the flow passage, and thus the liquid can absorb and remove the bubble generated in the flow passage. As described above, the exposure process can be performed in the state in which no bubble exists in the liquid on the optical path for the exposure light beam. Therefore, it is possible to avoid the deterioration of the pattern image which would be otherwise caused by the bubble. It is possible to produce a device having a high pattern accuracy.

In the exposure apparatus of the present invention, it is preferable that the bubble-suppressing unit includes a degassing unit which removes any gas from the liquid. It is preferable that the degassing unit includes a heating unit which heats the liquid. The heating unit may set a temperature T of the liquid to be 30° C.<T≦100° C. Further, the degassing unit may include a pressure-reducing unit which reduces a pressure in a unit in which the liquid is retained. The pressure-reducing unit may set the pressure depending on a temperature of the liquid. Further, it is preferable that the degassing unit determines a degassing level so that the bubble is not generated by any change in temperature of at least a part of the liquid disposed between the projection optical system and the substrate. It is also preferable that the degassing unit determines a degassing level so that the bubble is not generated by any change in pressure exerted on the liquid between the projection optical system and the substrate.

In the present invention, it is preferable that the degassing unit is a membrane degassing unit. It is preferable that the membrane degassing unit includes a hollow fiber member. The hollow fiber member may be gas-permeable and liquid-impermeable. Further, it is preferable that the liquid supply unit comprises a heating unit which heats the liquid which is to be supplied to the membrane degassing unit to decrease a concentration of dissolved gas in the liquid which is to be supplied to the membrane degassing unit.

In the exposure apparatus of the present invention, it is preferable that the liquid, for which the generation of the bubble has been suppressed by the bubble-suppressing unit, is supplied to the space between the projection optical system and the substrate without making a contact with gas.

In the exposure apparatus of the present invention, it is preferable that the liquid supply unit includes a filter unit which filters the liquid which is to be supplied to the space between the projection optical system and the substrate. It is preferable that the liquid supply unit further includes a temperature-adjusting unit which adjusts a temperature of the liquid having been degassed by the degassing unit.

In the exposure apparatus of the present invention, it is preferable that the liquid supply unit further includes a temperature-adjusting unit which adjusts a temperature of the liquid having been degassed by the degassing unit.

According to another aspect of the present invention, there is provided a method for producing a device, comprising using the exposure apparatus as defined in the first or second aspect of the present invention.

DESCRIPTION OF THE PREFERRED EMBODIMENTS OF THE INVENTION

Figure 1:
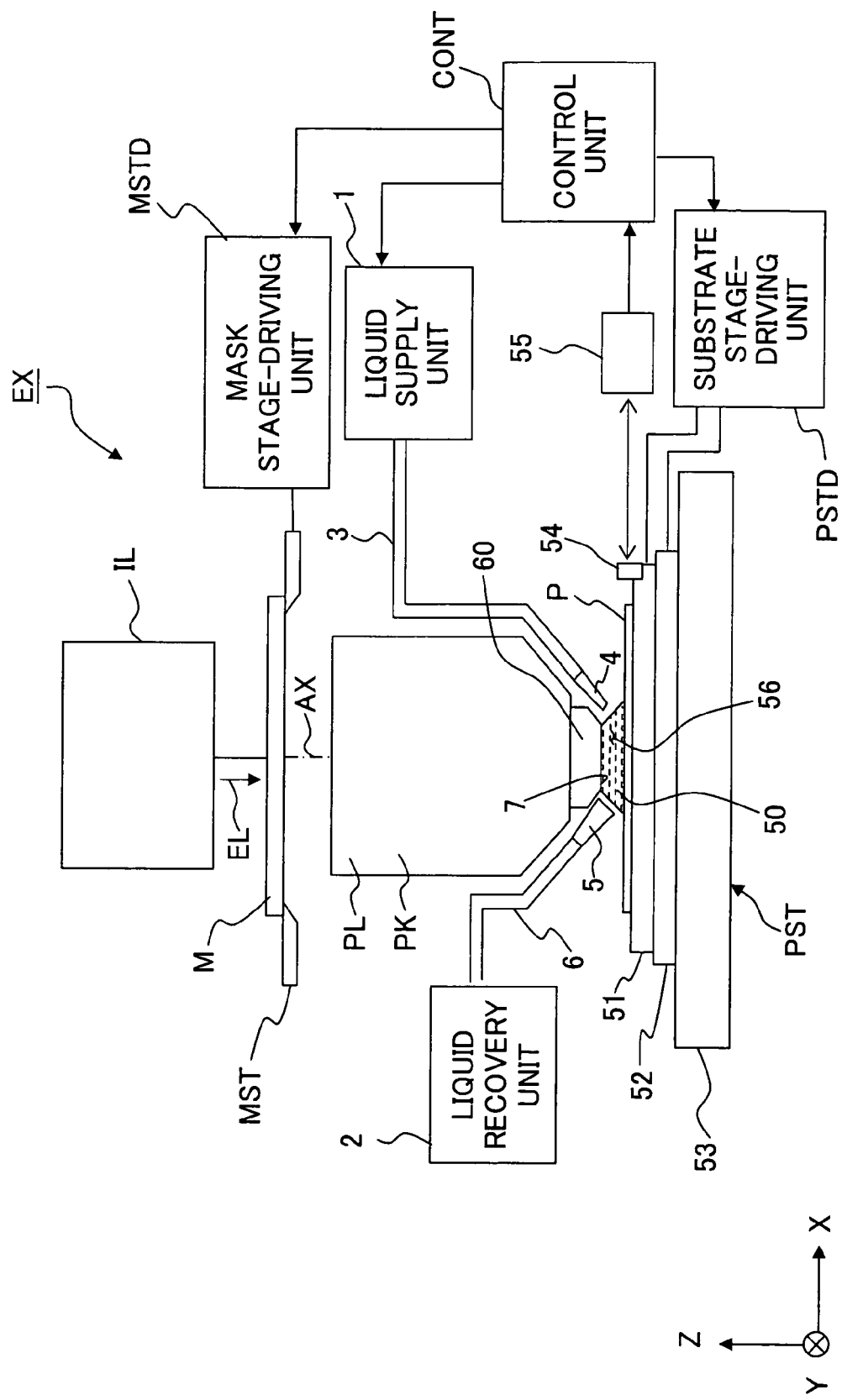
FIG. 1 shows a schematic arrangement illustrating an embodiment of the exposure apparatus of the present invention.

An explanation will be made below about the exposure apparatus and the method for producing the device according to the present invention with reference to the drawings. FIG. 1 shows a schematic arrangement illustrating an embodiment of the exposure apparatus of the present invention.

First Embodiment

With reference to FIG. 1, an exposure apparatus EX comprises a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, and a control unit CONT which collectively controls the overall operation of the exposure apparatus EX.

The embodiment of the present invention will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction is the direction which is coincident with the optical axis AX of the projection optical system PL, the X axis direction is the synchronous movement direction (scanning direction) for the mask M and the substrate P in the plane perpendicular to the Z axis direction, and the Y axis direction is the direction (non-scanning direction) perpendicular to the Z axis direction and the Y axis direction. The directions about the X axis, the Y axis, and the Z axis are designated as θX, θY, and θZ directions respectively. The term "substrate" referred to herein includes those obtained by applying a resist on a semiconductor wafer, and the term "mask" includes a reticle formed with a device pattern to be subjected to the reduction projection onto the substrate.

The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

The mask stage MST supports the mask M. The mask stage MST is two-dimensionally movable in the plane perpendicular to the optical axis AX of the projection optical system PL, i.e., in the XY plane, and it is finely rotatable in the δZ direction. The mask stage MST is driven by a mask stage-driving unit MSTD such as a linear motor. The mask stage-driving unit MSTD is controlled by the control unit CONT. The position in the two-dimensional direction and the angle of rotation of the mask M on the mask stage MST are measured in real-time by a laser interferometer. The result of the measurement is outputted to the control unit CONT. The control unit CONT drives the mask stage-driving unit MSTD on the basis of the result of the measurement obtained by the laser interferometer to thereby position the mask M supported on the mask stage MST.

The projection optical system PL projects the pattern on the mask M onto the substrate P at a predetermined projection magnification β to perform the exposure. The projection optical system PL includes a plurality of optical elements (lenses). The optical elements are supported by a barrel PK as a metal member. In this embodiment, the projection optical system PL is a reduction system having the projection magnification β which is, for example, ¼ or ⅕. The projection optical system PL may be any one of the 1× magnification system and the magnifying system. The optical element (lens) 60 is exposed from the barrel PK on the side of the tip (on the side of the substrate P) of the projection optical system PL of this embodiment. The optical element 60 is provided detachably (exchangeably) with respect to the barrel PK.

The substrate stage PST supports the substrate P. The substrate stage PST includes a Z stage 51 which holds the substrate P by the aid of a substrate holder, an XY stage 52 which supports the Z stage 51, and a base 53 which supports the XY stage 52. The substrate stage PST is driven by a substrate stage-driving unit PSTD such as a linear motor. The substrate stage-driving unit PSTD is controlled by the control unit CONT. When the Z stage 51 is driven, the substrate P, which is held on the Z stage 51, is subjected to the control of the position (focus position) in the Z axis direction and the positions in the θX and θY directions. When the XY stage 52 is driven, the substrate P is subjected to the control of the position in the XY directions (position in the directions substantially parallel to the image plane of the projection optical system PL). That is, the Z stage 51 controls the focus position and the angle of inclination of the substrate P so that the surface of the substrate P is adjusted to match the image plane of the projection optical system PL in the auto-focus manner and the auto-leveling manner. The XY stage 52 positions the substrate P in the X axis direction and the Y axis direction. It goes without saying that the Z stage and the XY stage may be provided as an integrated body.

A movement mirror 54, which is movable together with the substrate stage PST with respect to the projection optical system PL, is provided on the substrate stage PST (Z stage 51). A laser interferometer 55 is provided at a position opposed to the movement mirror 54. The angle of rotation and the position in the two-dimensional direction of the substrate P on the substrate stage PST are measured in real-time by the laser interferometer 55. The result of the measurement is outputted to the control unit CONT. The control unit CONT drives the substrate stage-driving unit PSTD on the basis of the result of the measurement of the laser interferometer 55 to thereby position the substrate P supported on the substrate stage PST.

In this embodiment, the liquid immersion method is applied in order that the resolution is improved by substantially shortening the exposure wavelength and the depth of focus is substantially widened. Therefore, the space between the surface of the substrate P and the tip surface (lower surface) 7 of the optical element (lens) 60 of the projection optical system PL on the side of the substrate P is filled with the predetermined liquid 50 at least during the period in which the image of the pattern on the mask M is transferred onto the substrate P. As described above, the lens 60 is exposed on the tip side of the projection optical system PL, and the liquid 50 is supplied to make contact only with the lens 60 by supply nozzles as described later on. Accordingly, the barrel PK composed of the metal is prevented from any corrosion or the like. In this embodiment, pure water is used for the liquid 50. The exposure light beam EL, which is not limited only to the ArF excimer laser beam, can be transmitted through pure water, even when the exposure light beam EL is, for example, the emission line (g-ray, h-ray, i-ray) in the ultraviolet region radiated, for example, from a mercury lamp or the far ultraviolet light beam (DUV light beam) such as the KrF excimer laser beam (wavelength: 248 nm).

The exposure apparatus EX includes a liquid supply unit 1 which supplies the predetermined liquid 50 to a space 56 between the substrate P and the tip surface (end surface of the lens 60) 7 of the projection optical system PL, and a liquid recovery unit 2 which recovers the liquid 50 from the space 56. The liquid supply unit 1 is provided to fill at least a part of the space between the projection optical system PL and the substrate P with the liquid 50. The liquid supply unit 1 includes, for example, a tank for accommodating the liquid 50, and a pressurizing pump. One end of a supply tube 3 is connected to the liquid supply unit 1. Supply nozzles 4 are connected to the other end of the supply tube 3. The liquid supply unit 1 supplies the liquid 50 to the space 56 through the supply tube 3 and the supply nozzles 4.

The liquid recovery unit 2 includes, for example, a suction pump, and a tank for accommodating the recovered liquid 50. One end of a recovery tube 6 is connected to the liquid recovery unit 2. Recovery nozzles 5 are connected to the other end of the recovery tube 6. The liquid recovery unit 2 recovers the liquid 50 from the space 56 through the recovery nozzles 5 and the recovery tube 6. When the space 56 is filled with the liquid 50, then the control unit CONT drives the liquid supply unit 1 so that the liquid 50, which is in a predetermined amount per unit time, is supplied to the space 56 through the supply tube 3 and the supply nozzles 4, and the control unit CONT drives the liquid recovery unit 2 so that the liquid 50, which is in a predetermined amount per unit time, is recovered from the space 56 through the recovery nozzles 5 and the recovery tube 6. Accordingly, the liquid 50 is retained in the space 56 between the substrate P and the tip surface 7 of the projection optical system PL.

Figure 2:
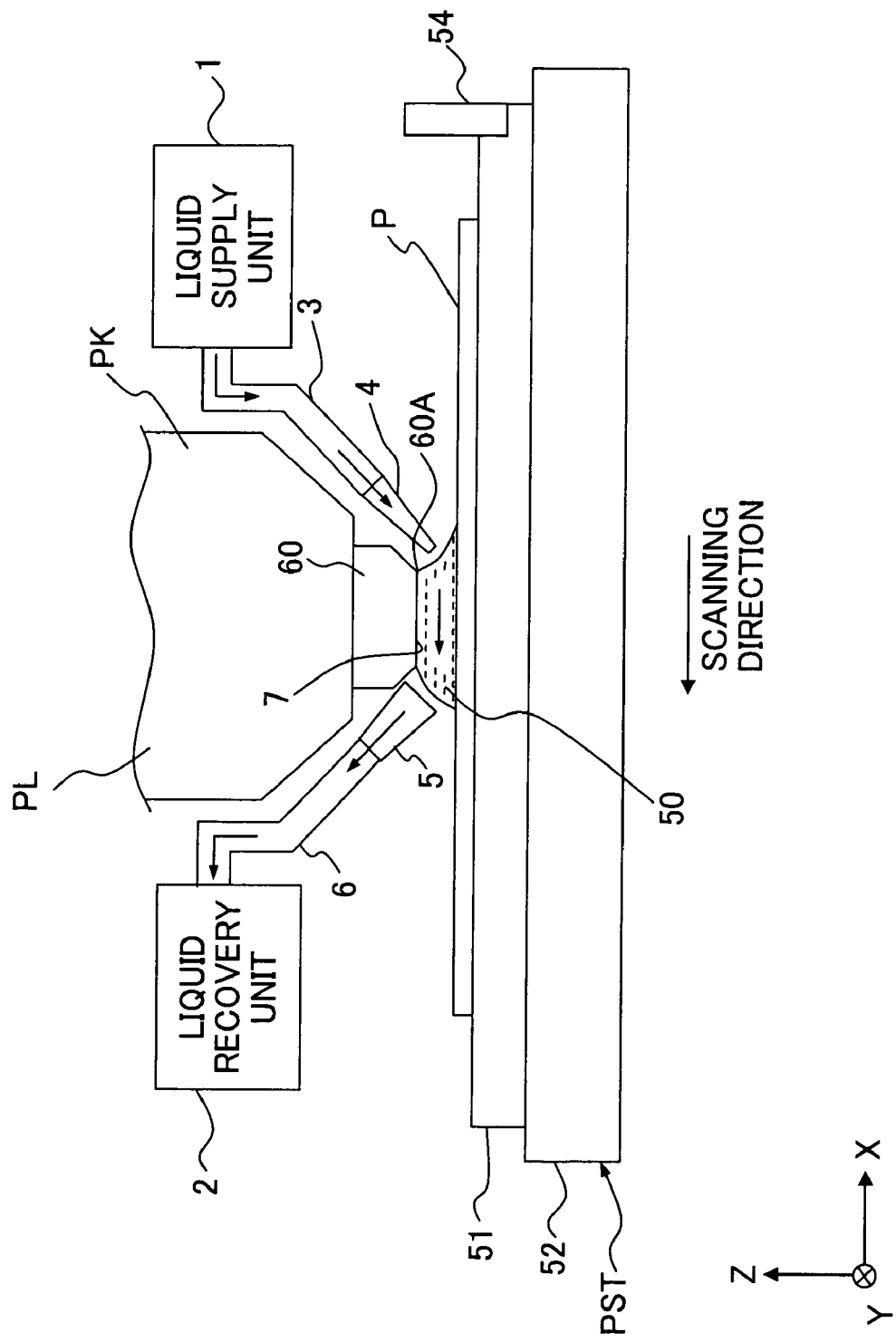
FIG. 2 shows a positional relationship among a tip section of a projection optical system, a liquid supply unit, and a liquid recovery unit.

FIG. 2 shows a partial magnified view of FIG. 1 illustrating, for example, the lower portion of the projection optical system PL of the exposure apparatus EX, the liquid supply unit 1, and the liquid recovery unit 2. In FIG. 2, the lens 60, which is disposed at the lowest end of the projection optical system PL has an end portion 60A which is formed so that the end portion 60A has a rectangular shape which is long in the Y axis direction (non-scanning direction) and which has necessary portion in the scanning direction. During the scanning exposure, a pattern image of a part of the mask M is projected onto the rectangular projection area disposed just under the end portion 60A. The mask M is moved at the velocity V in the −X direction (or in the +X direction) with respect to the projection optical system PL, in synchronization with which the substrate P is moved at the velocity $\beta \cdot V$ ($\beta$ is the projection magnification) in the +X direction (or in the −X direction) by the aid of the XY stage 52. After the completion of the exposure for one shot area, the next shot area is moved to the scanning start position in accordance with the stepping of the substrate P. The exposure process is successively performed thereafter for each of the shot areas in accordance with the step-and-scan system. This embodiment is designed so that the liquid 50 is allowed to flow in the same direction as the movement direction of the substrate P in parallel to the movement direction of the substrate P.

Figure 3:
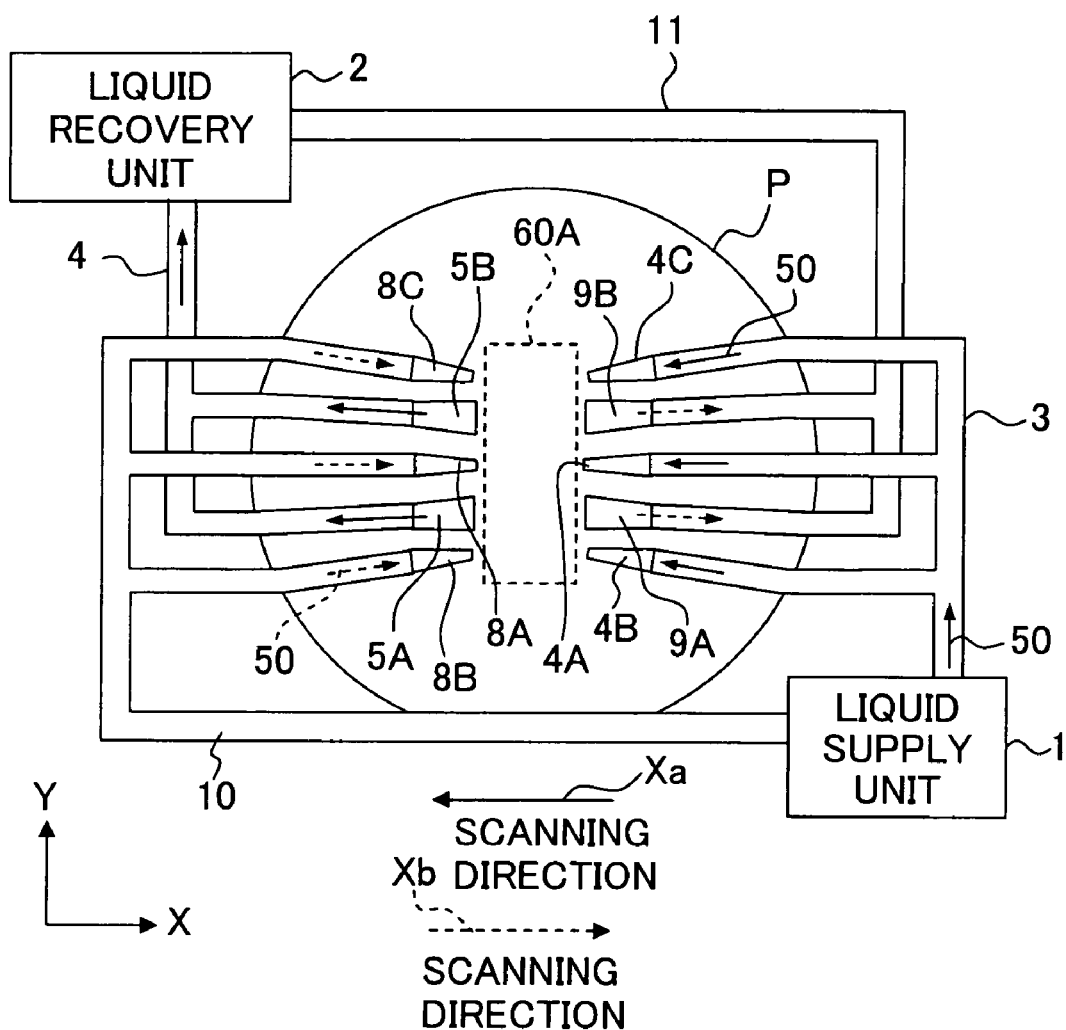
FIG. 3 shows an exemplary arrangement of supply nozzles and recovery nozzles.

FIG. 3 shows the positional relationship among the end portion 60A of the lens 60 of the projection optical system PL, the supply nozzles 4 (4A to 4C) for supplying the liquid 50 in the X axis direction, and the recovery nozzles 5 (5A, 5B) for recovering the liquid 50. In FIG. 3, the end portion 60A of the lens 60 has a rectangular shape which is long in the Y axis direction. The three supply nozzles 4A to 4C are arranged on the side in the +X direction, and the two recovery nozzles 5A, 5B are arranged on the side in the −X direction so that the end portion 60A of the lens 60 of the projection optical system PL is interposed therebetween in the X axis direction. The supply nozzles 4A to 4C are connected to the liquid supply unit 1 through the supply tube 3, and the recovery nozzles 5A, 5B are connected to the liquid recovery unit 2 through the recovery tube 4. Further, the supply nozzles 8A to 8C and the recovery nozzles 9A, 9B are arranged at positions obtained by rotating, by substantially 180°, the positions of the supply nozzles 4A to 4C and the recovery nozzles 5A, 5B about the center of the end portion 60A. The supply nozzles 4A to 4C and the recovery nozzles 9A, 9B are alternately arranged in the Y axis direction. The supply nozzles 8A to 8C and the recovery nozzles 5A, 5B are alternately arranged in the Y axis direction. The supply nozzles 8A to 8C are connected to the liquid supply unit 1 through the supply tube 10. The recovery nozzles 9A, 9B are connected to the liquid recovery unit 2 through the recovery tube 11. The liquid is supplied from the nozzles so that no gas portion is generated between the projection optical system PL and the substrate P.

Figure 4:
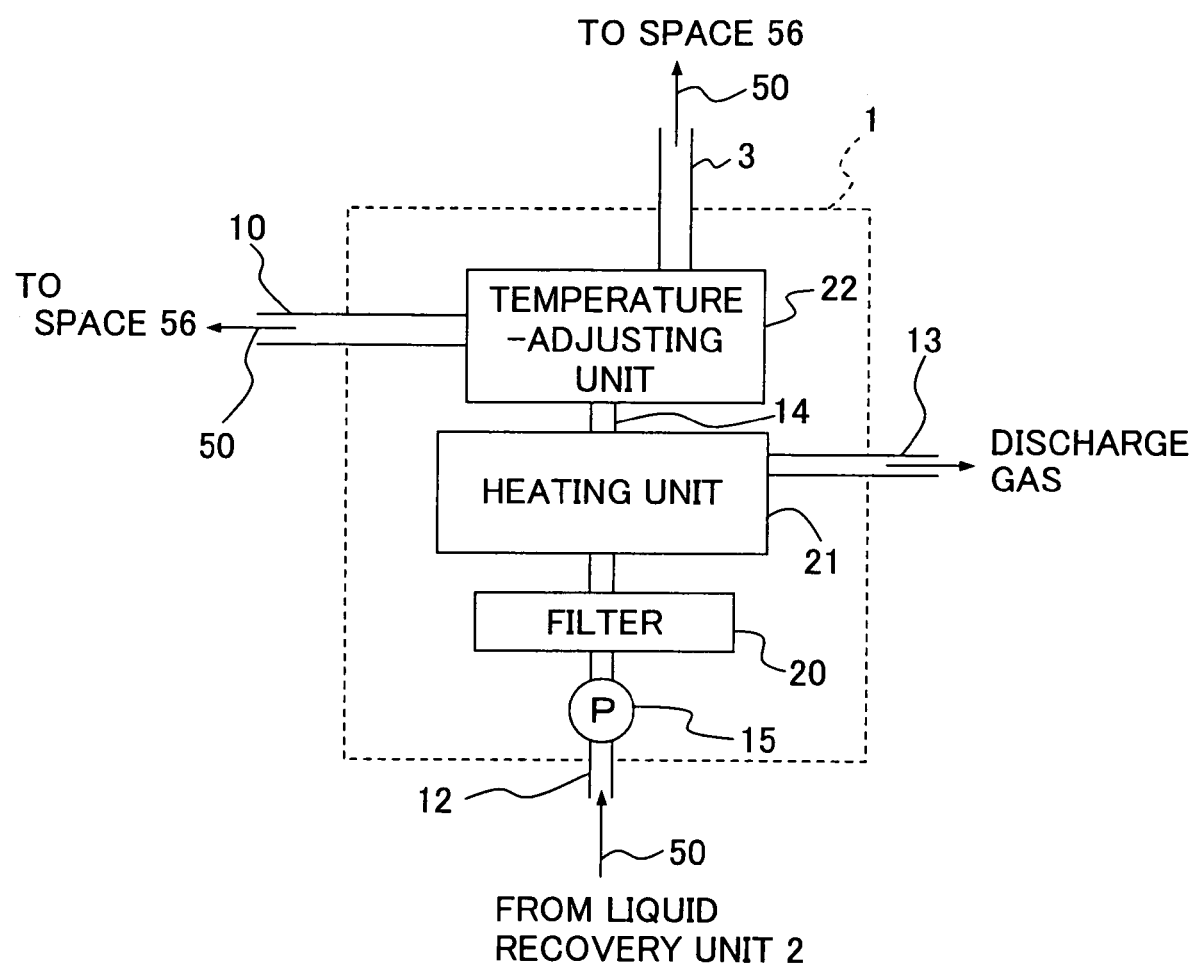
FIG. 4 shows a schematic arrangement illustrating an embodiment of the liquid supply unit.

FIG. 4 shows an arrangement of the liquid supply unit 1. As shown in FIG. 4, the liquid supply unit 1 includes a degassing unit 21 as a bubble-suppressing unit which suppresses the generation of the bubble in the liquid 50. The degassing unit 21 shown in FIG. 4 includes a heating unit which heats the liquid 50. In this embodiment, the liquid 50 is circulated between the liquid supply unit 1 and the liquid recovery unit 2. The liquid 50, which is supplied from the liquid recovery unit 2, is returned to the liquid supply unit 1 through a circulating tube 12. A pressurizing pump 15, which feeds the liquid toward the upstream side, is provided for the liquid supply unit 1.

The liquid supply unit 1 includes a filter 20 which removes any foreign matter or the like from the liquid 50 recovered by the liquid recovery unit 2, for example, by filtering the liquid 50 recovered by the liquid recovery unit 2 in order to avoid any pollution of the substrate P and the projection optical system PL and/or avoid any deterioration of the pattern image projected onto the substrate P, the heating unit 21 which heats the liquid 50 having passed through the filter 20 to a predetermined temperature (for example, 90° C.), and a temperature-adjusting unit 22 which adjusts the temperature of the liquid 50 having been heated by the heating unit 21 to a desired temperature. Although not shown in FIG. 4, the liquid supply unit 1 includes a reservoir such as a tank capable of retaining a predetermined amount of the liquid 50. In this embodiment, the temperature-adjusting unit 22, which is provided for the liquid supply unit 1, sets the temperature of the liquid 50 to be supplied to the space 56 to be approximately equivalent, for example, to the temperature (for example, 23° C.) in the chamber in which the exposure apparatus EX is accommodated. Supply tubes 3, 10 are connected to the temperature-adjusting unit 22. The liquid 50, which has been temperature-adjusted by the temperature-adjusting unit 22, is supplied to the space 56 through the supply tube 3 (10).

As for the heating unit 21, for example, the liquid 50 is accommodated in an accommodating unit such as a tank, and the liquid 50 is heated by heating the accommodating unit. A discharge tube 13, which constitutes a part of a discharge unit, is connected to the accommodating unit. The operation of the heating unit 21 is controlled by the control unit CONT. The heating unit 21 heats the liquid 50 to a predetermined temperature, and thus the gas, which is dissolved in the liquid 50, is removed (degassed) from the liquid 50. The extracted gas component is discharged through the discharge tube 13 to the outside of the apparatus. The liquid 50 is degassed by the heating unit 21, and thus the generation of the bubble is suppressed. For example, the following technique may be adopted for the heating unit 21. That is, an electric heater is wound around the outer circumference of a stainless steel reservoir capable of retaining the liquid 50, and the temperature of the electric heater is controlled. Alternatively, a helical tube made of stainless steel is immersed in a temperature-controlled high temperature liquid, and the liquid 50 is allowed to flow through the helical tube.

In this embodiment, the heating unit 21 sets the temperature of the liquid 50 to be not less than 30° C. and not more than 100° C. That is, the liquid 50 is heated at a temperature higher than the temperature (for example, 23° C. as the temperature in the chamber) set by the temperature-adjusting unit 22, and within a temperature range of not more than the boiling point of the liquid. The heating unit 21 degasses the liquid 50 by heating the liquid 50 within the temperature range as described above to suppress the generation of the bubble in the liquid 50 to be supplied to the space 56. In particular, the heating unit 21 can sufficiently degas the liquid 50 by heating the liquid 50 to the boiling point thereof.

It is preferable that the liquid 50 is set by the heating unit 21 to have a temperature which is higher than the temperature in the chamber (space 56) and which is not more than the boiling point. Therefore, when the liquid 50 is a liquid other than water, the heating unit 21 heats the liquid depending on the boiling point of the liquid.

Next, an explanation will be made about a procedure for exposing the substrate P with the pattern of the mask M by using the exposure apparatus EX described above.

When the mask M is loaded on the mask stage MST, and the substrate P is loaded on the substrate stage PST, then the control unit CONT drives the liquid supply unit 1 to start the operation for supplying the liquid to the space 56. The liquid 50 passes through the filter 20 in the liquid supply unit 1, and thus the liquid 50 is supplied to the heating unit 21 in a state in which any foreign matter or the like is removed therefrom. The liquid 50, which is supplied to the heating unit 21, is heated to a predetermined temperature. The liquid 50 is degassed by being heated to the predetermined temperature by the heating unit 21. The removed gas component is discharged to the outside of the apparatus through the discharge tube 13 which constitutes a part of the discharge unit. The degassed liquid 50 is supplied to the temperature-adjusting unit 22. After the temperature is adjusted, for example, to a temperature approximately equal to the temperature in the chamber, the liquid 50 is supplied to the space 56 through the supply tube 3 and the supply nozzles 4. It is noted that the flow passage for the liquid 50, which includes, for example, the tube 14 for connecting the heating unit 21 and the temperature-adjusting unit 22, the temperature-adjusting unit 22, and the supply tube 3, is tightly closed and sealed. The liquid 50 flows through the flow passage in a state in which the flow passage is sufficiently filled with the liquid 50. That is, the liquid 50, which flows through the flow passage, is supplied to the space 56 without making any contact with the gas. The inner wall surface (contact surface with the liquid), which includes those of the supply tube 3 and the like for forming the flow passage running from the heating unit 21 to achieve the supply to the space 56, is hydrophilic. The generation of the bubble in the liquid is suppressed in the flow passage running from the heating unit 21 to the space 56. In this case, for example, a stainless steel pipe subjected to the electrolytic polishing may be used as the supply tube 3. It is also preferable that the liquid 50 in the degassed state is stored in a storage reservoir or a pipe without making contact with the gas, and the liquid 50 is supplied to the space 56 at a desired timing. In this procedure, the flow passage, the storage reservoir, and the pipe also function as parts of the bubble-suppressing unit, in addition to the heating unit 21.

When the scanning exposure is performed by moving the substrate P in the scanning direction (−X direction) indicated by an arrow Xa (see FIG. 3), the liquid 50 is supplied and recovered with the liquid supply unit 1 and the liquid recovery unit 2 by using the supply tube 3, the supply nozzles 4A to 4C, the recovery tube 4, and the recovery nozzles 5A, 5B. That is, when the substrate P is moved in the −X direction, then the liquid 50, for which the generation of the bubble is suppressed, is supplied to the space between the projection optical system PL and the substrate P from the liquid supply unit 1 through the supply tube 3 and the supply nozzles 4 (4A to 4C), and the liquid 50 is recovered to the liquid recovery unit 2 through the recovery nozzles 5 (5A, 5B) and the recovery tube 6. The liquid 50 flows in the −X direction so that the space between the lens 60 and the substrate P is filled therewith. On the other hand, when the scanning exposure is performed by moving the substrate P in the scanning direction (+X direction) indicated by an arrow Xb, then the liquid 50 is supplied and recovered with the liquid supply unit 1 and the liquid recovery unit 2 by using the supply tube 10, the supply nozzles 8A to 8C, the recovery tube 11, and the recovery nozzles 9A, 9B. That is, when the substrate P is moved in the +X direction, then the degassed liquid 50 is supplied from the liquid supply unit 1 to the space between the projection optical system PL and the substrate P through the supply tube 10 and the supply nozzles 8 (8A to 8C), and the liquid 50 is recovered to the liquid recovery unit 2 through the recovery nozzles 9 (9A, 9B) and the recovery tube 11. The liquid 50 flows in the +X direction so that the space between the lens 60 and the substrate P is filled therewith. As described above, the control unit CONT allows the liquid 50 to flow in the movement direction of the substrate P by using the liquid supply unit 1 and the liquid recovery unit 2. In this arrangement, for example, the liquid 50, which is supplied from the liquid supply unit 1 through the supply nozzles 4, flows so that the liquid 50 is attracted and introduced into the space 56 in accordance with the movement of the substrate P in the −X direction. Therefore, even when the supply energy of the liquid supply unit 1 is small, the liquid 50 can be supplied to the space 56 with ease. When the direction, in which the liquid 50 is allowed to flow, is switched depending on the scanning direction, then it is possible to fill the space between the substrate P and the tip surface 7 of the lens 60 with the liquid 50, and it is possible to obtain the high resolution and the wide depth of focus, even when the substrate P is subjected to the scanning in any one of the +X direction and the −X direction.

As explained above, the heating unit 21, which heats the liquid 50, is provided for the exposure apparatus, especially for the liquid supply unit 1 for supplying the liquid 50 to the space between the projection optical system PL and the substrate P. Accordingly, the liquid 50 can be supplied to the space between the projection optical system PL and the substrate P, after the liquid 50 is sufficiently degassed. Therefore, it is possible to suppress the generation of the bubble in the liquid 50 which fills the space between the projection optical system PL and the substrate P during the exposure process. Even if the bubble is generated by any cause, for example, in the flow passage between the heating unit (degassing unit) 21 and the space 56, on the tip surface 7 of the projection optical system PL, or on the surface of the substrate P, then the liquid 50, which is sufficiently degassed, flows through the flow passage and the space 56, and thus the liquid 50 can absorb and remove the bubble existing in the flow passage. The liquid 50, which is supplied to the space 56 between the projection optical system PL and the substrate P, makes contact with the gas (air) existing therearound. Therefore, it is feared that the gas (air) existing therearound may be dissolved in the liquid 50. However, it takes about several minutes to dissolve the gas (air) in the liquid 50. Therefore, the liquid 50, which is supplied from the liquid supply unit 1, is recovered by the liquid recovery unit 2, before the liquid 50 loses the degassed property. Therefore, no bubble is generated as well in the liquid 50 between the projection optical system PL and the substrate P by the dissolution of the gas (air) in the liquid 50 in the space 56. As described above, the exposure process can be performed in the state in which no bubble exists in the liquid 50 on the optical path for the exposure light beam EL. Therefore, it is possible to avoid the deterioration of the pattern image which would be otherwise caused by the bubble, and it is possible to produce a device having a high pattern accuracy. It is also allowable that the heating unit 21 is not provided in the liquid supply unit 1. The heating unit 21 may be provided at a place separated from the liquid supply unit 1, or the heating unit 21 may be provided inside or outside the chamber of the exposure apparatus.

The liquid 50 is supplied to the space in the state in which the temperature is adjusted by the temperature-adjusting unit 22. Therefore, the temperature is adjusted for the surface of the substrate P. It is possible to avoid the deterioration of, for example, the alignment accuracy, which would be otherwise caused by the thermal expansion of the substrate P due to the heat generated during the exposure.

As described above, pure water is used as the liquid 50 in this embodiment. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the tip surface of the projection optical system PL.

It is approved that the refractive index n of pure water (water) with respect to the exposure light beam EL having a wavelength of about 193 nm is approximately in an extent of 1.44 to 1.47. When the ArF excimer laser beam (wavelength: 193 nm) is used as the light source of the exposure light beam EL, then the wavelength is shortened on the substrate P by 1/n, i.e., to about 131 to 134 nm, and a high resolution is obtained. Further, the depth of focus is magnified about n times, i.e., about 1.44 to 1.47 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In this embodiment, the lens 60 is attached to the tip of the projection optical system PL. However, the optical element, which is attached to the tip of the projection optical system PL, may be an optical plate which is usable to adjust the optical characteristics of the projection optical system PL, for example, the aberration (for example, spherical aberration and comatic aberration). Alternatively, the optical element may be a parallel plane plate through which the exposure light beam EL is transmissive. When the optical element, which makes contact with the liquid 50, is the parallel plane plate which is cheaper than the lens, it is enough that the parallel plane plate is merely exchanged immediately before supplying the liquid 50 even when any substance (for example, any silicon-based organic matter), which deteriorates the transmittance of the projection optical system PL, the illuminance of the exposure light beam EL on the substrate P, and the uniformity of the illuminance distribution, is adhered to the parallel plane plate, for example, during the transport, the assembling, and/or the adjustment of the exposure apparatus EX. An advantage is obtained such that the exchange cost is lowered as compared with the case in which the optical element to make contact with the liquid 50 is the lens. That is, the surface of the optical element to make contact with the liquid 50 is dirtied, for example, due to the adhesion of scattered particles generated from the resist by being irradiated with the exposure light beam EL or any impurity contained in the liquid 50. Therefore, it is necessary to periodically exchange the optical element. However, when the optical element is the cheap parallel plane plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid 50, is large between the substrate P and the optical element disposed at the tip of the projection optical system PL, it is also allowable that the optical element is tightly fixed so that the optical element is not moved by the pressure, rather than allowing the optical element to be exchangeable.

This embodiment is constructed such that the space between the projection optical system PL and the surface of the substrate P is filled with the liquid 50. However, for example, the space may be filled with the liquid 50 in a state in which a cover glass composed of a parallel flat plate is attached to the surface of the substrate P.

The liquid 50 is water in this embodiment. However, the liquid 50 may be any liquid other than water. For example, when the light source of the exposure light beam EL is the $F_2$ laser, the $F_2$ laser beam is not transmitted through water. Therefore, in this case, for example, it is also allowable to use, as the liquid 50, fluorine-based oil (fluorine-based liquid) and perfluoropolyether (PFPE) through which the $F_2$ laser beam is transmissive. Alternatively, other than the above, it is also possible to use, as the liquid 50, those (for example, cedar oil) which have the transmittance with respect to the exposure light beam EL, which have the refractive index as high as possible, and which are stable against the photoresist applied to the surface of the substrate P and the projection optical system PL.

Second Embodiment

Next, an explanation will be made with reference to FIG. 5 about a second embodiment of the exposure apparatus EX of the present invention. In the following description, the same or equivalent constitutive parts as those of the embodiment described above are designated by the same reference numerals, any explanation of which is simplified or omitted. The characteristic feature of this embodiment is that a pressure-reducing unit 23 is provided in place of the heating unit 21.

Figure 5:
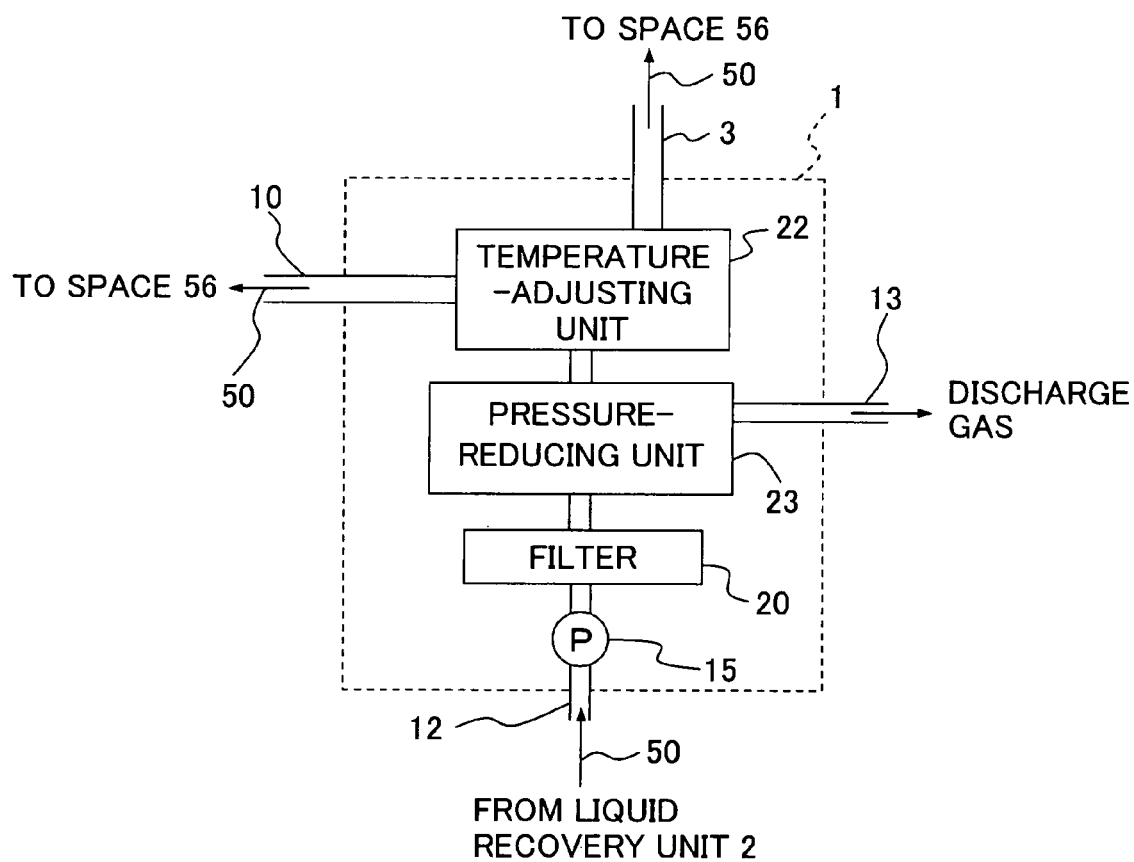
FIG. 5 shows a schematic arrangement illustrating another embodiment of the liquid supply unit.

As shown in FIG. 5, the liquid supply unit 1 includes a filter 20 which removes any foreign matter from the liquid 50, for example, by filtering the liquid 50 recovered by the liquid recovery unit 2 in order to avoid any pollution of the substrate P and the projection optical system PL and/or avoid any deterioration of the pattern image projected onto the substrate P, the pressure-reducing unit 23 which degasses the liquid 50 by reducing the pressure of the liquid 50 from which the foreign matter has been removed by the filter 20, a temperature-adjusting unit 22 which adjusts the temperature of the liquid 50 having been subjected to the degassing treatment by the pressure-reducing unit 23 to a temperature approximately identical to the temperature in the chamber, and a pressurizing pump 15. The pressure-reducing unit 23 includes a reservoir which retains the liquid 50. The liquid 50 is degassed by reducing the pressure in the reservoir. The liquid 50 can be also degassed by reducing the pressure rather than by heating the liquid 50 as described above. The pressure-reducing unit 50 may include, for example, a reservoir which is capable of retaining a predetermined amount of the liquid 50, and a vacuum pump which is connected to the reservoir and which reduces the pressure of the gas that makes contact with the liquid 50 in the reservoir.

The heating treatment and the pressure-reducing treatment may be performed simultaneously for the liquid 50 in order to degas the liquid 50. That is, the pressure-reducing unit 23, which has the reservoir capable of retaining the liquid 50, may be provided with a heating unit for heating the reservoir. The pressure-reducing unit 23 can degas the liquid 50 by accommodating the liquid 50 in the reservoir and heating the liquid 50 by using the heating unit while reducing the pressure in the reservoir.

In this procedure, the pressure-reducing unit 23 sets the pressure depending on the temperature of the liquid 50. That is, a sufficient degassing effect is obtained by heating the liquid 50 to the boiling point. However, the boiling point of the liquid 50 depends on the pressure. Therefore, the liquid 50 can be degassed efficiently and satisfactorily by setting the pressure depending on the temperature of the liquid 50. For example, the pressure (boiling pressure), at which the boiling point of water as the liquid 50 is 100° C., is the atmospheric pressure (101,325 Pa). The boiling pressure, at which the boiling point is 90° C., is 70,121 Pa. Similarly, the boiling pressure is 47,377 Pa at a boiling point of 80° C., the boiling pressure is 12,345 Pa at a boiling point of 50° C., the boiling pressure is 4,244.9 Pa at a boiling point of 30° C., and the boiling pressure is 2,338.1 Pa at a boiling point of 20° C. Therefore, for example, when the temperature of the liquid 50 is set to 100° C. by the heating unit, the pressure-reducing unit 23 can degas the liquid 50 by boiling the liquid 50 at the atmospheric pressure without performing the pressure-reducing treatment. On the other hand, when the temperature of the liquid 50 is 90° C., the pressure-reducing unit 23 can degas the liquid 50 by boiling the liquid 50 by setting the pressure to be within a range from the atmospheric pressure to the boiling pressure (70,121 Pa) at the temperature of 90° C. Similarly, for example, when the temperature of the liquid 50 is 30 ° C., the pressure-reducing unit 23 can degas the liquid 50 by boiling the liquid 50 by setting the pressure to be within a range from the atmospheric pressure to the boiling pressure (4,244.9 Pa). As described above, the boiling point of the liquid 50 varies depending on the pressure. Therefore, the pressure-reducing unit 23 can degas the liquid 50 satisfactorily by setting the pressure depending on the temperature of the liquid 50.

The degassing level of the liquid 50 to be supplied to the space between the projection optical system PL and the substrate P, i.e., the concentration of dissolved gas of the liquid 50 may be determined depending on the condition of use of the liquid 50 (for example, the exposure condition). In the case of the liquid immersion exposure, the temperature of the liquid 50 disposed between the projection optical system PL and the substrate P is entirely or partially raised during the exposure due to the radiation of the exposure light beam EL or the heat of the substrate P heated by the radiation of the exposure light beam EL. The increase in the temperature of the liquid 50 differs, for example, depending on the intensity of the exposure light beam EL, which is about several degrees (1 to 3° C.). However, if the degassing level of the liquid 50 is low, there is such a possibility that the gas, which has been dissolved in the liquid 50, may be converted into the generated bubble due to the increase in the temperature of the liquid 50. Therefore, it is necessary to set the degassing level of the liquid 50 so that the bubble is not generated even when the increase in the temperature arises in the liquid 50 between the projection optical system PL and the substrate P. For example, as described above, when the liquid, which is temperature-controlled to about 23° C., is supplied to the space between the projection optical system PL and the substrate P, the degassing level may be set so that the bubble is not generated, for example, even when the temperature of the liquid is raised to 30° C., in view of the safety. Specifically, the degassing level of the liquid 50, i.e., of water may be set to be not more than the saturation amount of air dissolved in water at 30° C., i.e., 0.016 $cm^3/cm^3$ (not more than 13 ppm for $N_2$ and not more than 7.8 ppm for $O_2$ as expressed by the mass ratio). The expression "$cm^3/cm^3$" indicates the volume $cm^3$ of air dissolved in 1 $cm^3$ of water.

In the case of the liquid immersion exposure, when the flow appears in the liquid 50 between the projection optical system PL and the substrate P, the pressure change arises in the liquid 50. The pressure change differs depending on, for example, the supply amount of the liquid, the recovery amount of the liquid, and the movement speed of the substrate P, which is about several hundreds Pa (100 to 300 Pa). However, if the degassing level of the liquid 50 is low, there is such a possibility that the bubble may be generated in the liquid 50 due to the pressure change in relation to the liquid 50. Therefore, the degassing level of the liquid 50 may be set so that the bubble is not generated by the pressure change of several hundreds Pa of the liquid 50.

When it is difficult to raise the degassing level, it is also allowable that the exposure condition is determined so that the temperature change and the pressure change, which may generate the bubble, do not occur in the liquid between the projection optical system PL and the substrate P. The exposure condition includes at least one of the supply amount of the liquid, the recovery amount of the liquid, the movement speed of the substrate P, the exposure light beam intensity, the emission cycle of the exposure pulse light beam (pulse interval), and the pulse width of the exposure pulse light beam. It goes without saying that it is necessary to determine the exposure condition in view of the prevention of the occurrence of the bubble as well as the prevention of the deterioration of the image formation of the pattern image resulting from the change in the refractive index of the liquid, when the exposure condition is determined in consideration of the temperature change and the pressure change of the liquid.

Third Embodiment

Figure 6:
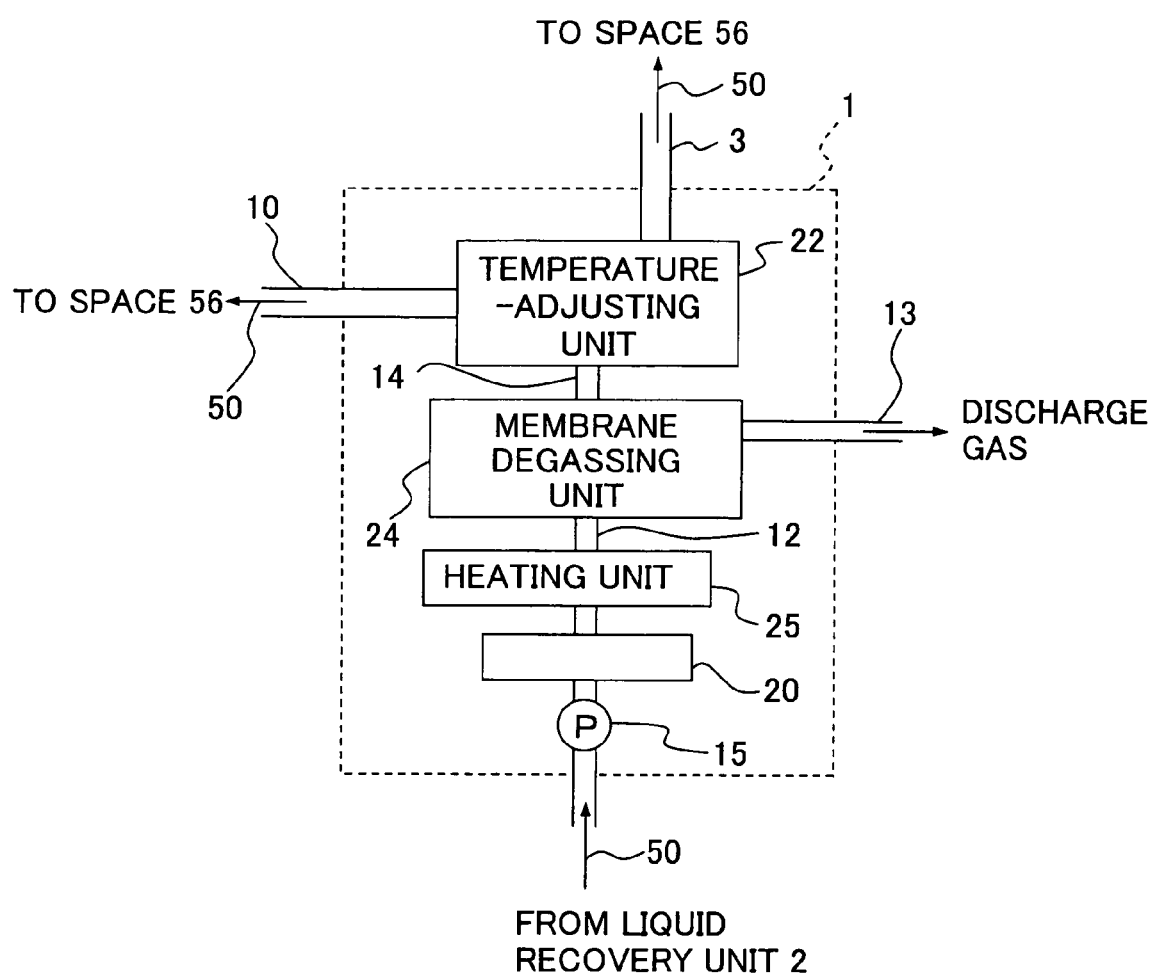
FIG. 6 shows a schematic arrangement illustrating still another embodiment of the liquid supply unit.

An explanation will be made with reference to FIGS. 6 and 7 about a third embodiment of the exposure apparatus EX of the present invention. The exposure apparatus of this embodiment is provided with a membrane degassing unit 24 and a heating unit 25 as shown in FIG. 6 in place of the heating unit of the liquid supply unit in the first embodiment. In the following description, the same or equivalent constitutive parts as those of the embodiment described above are designated by the same reference numerals, any explanation of which is simplified or omitted.

FIG. 6 shows an arrangement of the liquid supply unit 1. As shown in FIG. 6, the liquid supply unit 1 includes a filter 20 which removes any foreign matter or the like from the liquid 50 recovered by the liquid recovery unit 2, for example, by filtering the liquid 50 recovered by the liquid recovery unit 2 in order to avoid any pollution for the substrate P and the projection optical system PL and/or avoid any deterioration of the pattern image projected onto the substrate P, the heating unit 25 which heats the liquid 50 having passed through the filter 20 to a predetermined temperature, the membrane degassing unit 24 which removes the gas from the liquid 50 heated by the heating unit 25, a temperature-adjusting unit 22 which adjusts the temperature of the liquid 50 having been subjected to the degassing treatment by the membrane degassing unit 24 to be a desired temperature, and a pressurizing pump 15. The liquid 50, for which the concentration of dissolved gas has been lowered by the heating unit 25, is supplied to the membrane degassing unit 24 through the tube 12. The liquid 50, which has been degassed by the membrane degassing unit 24, is supplied to the temperature-adjusting unit 22 through the tube 14. The membrane degassing unit 24 is connected to the discharge tube 13 to discharge the gas removed (degassed) from the liquid 50. The temperature-adjusting unit 22 sets the temperature of the liquid 50 to be supplied to the space 56 to be approximately equivalent, for example, to the temperature (for example, 23° C.) in the chamber in which the exposure apparatus EX is accommodated. Supply tubes 3, 10 are connected to the temperature-adjusting unit 22. The liquid 50, which has been temperature-adjusted by the temperature-adjusting unit 22, is supplied to the space 56 through the supply tube 3 (10) by the pressurizing pump 15. The operation of the membrane degassing unit 24 is also controlled by the control unit CONT.

Figure 7:
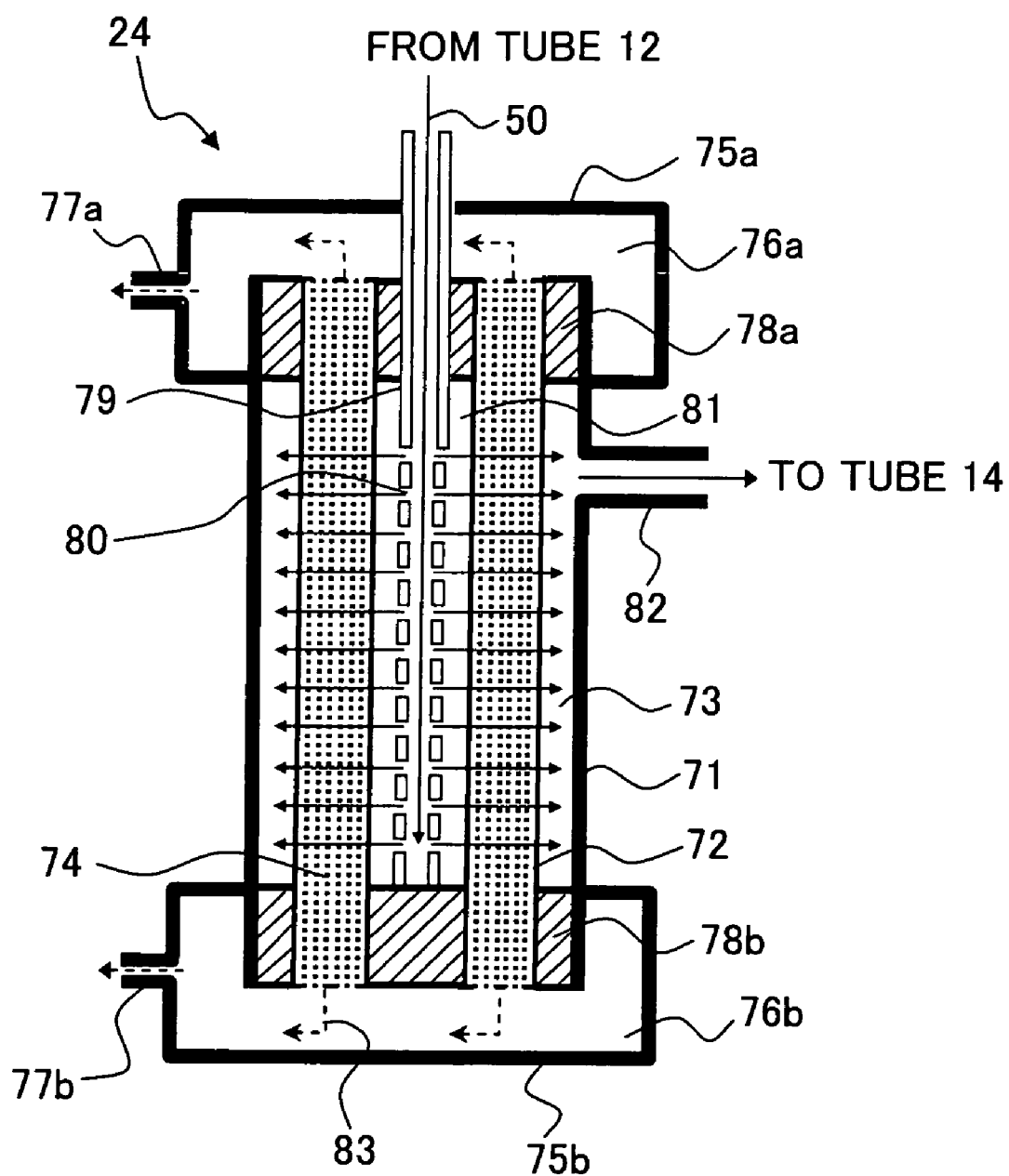
FIG. 7 shows a sectional view illustrating a schematic arrangement of a membrane degassing unit.

FIG. 7 shows a sectional view illustrating a schematic arrangement of the membrane degassing unit 24. A cylindrical hollow fiber bundle 72 is accommodated in a housing 71 while leaving a predetermined space 73. The hollow fiber bundle 72 includes a plurality of straw-shaped hollow fiber membranes 74 which are bundled in parallel. Each of the hollow fiber membranes 74 is formed of a material (for example, poly-4-methylpentene-1) which is highly hydrophobic and which is excellent in gas permeability. Vacuum cap members 75a, 75b are fixed at the both ends of the housing 71. Tightly sealed spaces 76a, 76b are formed at the outside of the housing 71 at the both ends. Degassing ports 77a, 77b, which are connected to an unillustrated vacuum pump, are provided for the vacuum cap members 75a, 75b. Sealing sections 78a, 78b are formed at the both ends of the housing 71 so that only the both ends of the hollow fiber bundle 72 are connected to the tightly sealed spaces 76a, 76b, respectively. The vacuum pump, which is connected to the degassing ports 77a, 77b, can be used to provide the pressure-reduced state for the inside of each of the hollow fiber membranes 74. A tube 79, which is connected to the tube 12, is arranged in the hollow fiber bundle 72. The tube 79 is provided with a plurality of liquid supply holes 80. The liquid 50 is supplied from the liquid supply holes 80 to a space 81 which is surrounded by the sealing sections 78a, 78b and the hollow fiber bundle 72. When the liquid 50 is continuously supplied from the liquid supply holes 80 to the space 81, then the liquid 50 flows toward the outside so that the liquid 50 traverses the layers of the hollow fiber membranes 74 bundled in parallel, and the liquid 50 makes contact with the outer surfaces of the hollow fiber membranes 74. As described above, each of the hollow fiber membranes 74 is formed of the material which is highly hydrophobic and which is excellent in gas permeability. Therefore, the liquid 50 does not enter the inside of the hollow fiber membrane 74, and the liquid 50 passes through interstices of the respective hollow fiber membranes 74 to move to the space 73 disposed outside the hollow fiber bundle 72. On the other hand, the gas (molecule) dissolved in the liquid 50 is moved (absorbed) to the inside of each of the hollow fiber membranes 74, because the inside of each of the hollow fiber membranes 74 is in a pressure-reducer state (about 20 Torr). The gas component, which is removed (degassed) from the liquid 50 during the traverse across the layers of the hollow fiber membranes 74 as described above, passes through the both ends of the hollow fiber bundle 72, and the gas component is discharged from the degassing ports 77a, 77b via the tightly sealed spaces 76a, 76b as shown by arrows 83. The liquid 50, which has been subjected to the degassing treatment, is supplied to the temperature-adjusting unit 22 through the tube 14 from a liquid outlet 82 provided for the housing 51.

As explained above, the liquid supply unit 1, which supplies the liquid 50 to the space between the projection optical system PL and the substrate P, is provided with the membrane degassing unit 24 which removes (degasses) the gas from the liquid 50. Accordingly, the liquid 50 can be supplied to the space between the projection optical system PL and the substrate P after the liquid 50 is sufficiently degassed. Therefore, it is possible to suppress the generation of the bubble in the liquid 50 which fills the space between the projection optical system PL and the substrate P during the exposure process. Even if the bubble is generated by any cause, for example, in the flow passage between the membrane degassing unit 24 and the space 56, on the tip surface 7 of the projection optical system PL, or on the surface of the substrate P, then the sufficiently degassed liquid 50 flows through the flow passage and the space 56, and thus the liquid 50 can absorb and remove the bubble existing in the flow passage. As described above, the exposure process can be performed in the state in which no bubble is present in the liquid 50 on the optical path for the exposure light beam EL. Therefore, it is possible to avoid the deterioration of the pattern image which would be otherwise caused by the bubble, and it is possible to produce a device having a high pattern accuracy.

In this embodiment, the liquid is heated by the heating unit 25 to lower the concentration of dissolved gas, and then the liquid is supplied to the membrane degassing unit 24. Thus, the degassing level is improved for the liquid to be supplied to the space 56. However, a pressure-reducing unit may be used in place of the heating unit 25 to lower the concentration of dissolved gas, and then the liquid may be supplied to the membrane degassing unit 24. When the degassing ability of the membrane degassing unit 24 is sufficiently high, the liquid, which has passed through the filter 20, may be introduced into the membrane degassing unit 24 without passing along the heating unit and the pressure-reducing unit.

In the respective embodiments described above, the shape of the nozzle is not specifically limited. For example, two pairs of the nozzles may be used to supply or recover the liquid 50 for the long side of the end portion 60A. In this arrangement, the supply nozzles and the recovery nozzles may be arranged while being aligned vertically in order that the liquid 50 can be supplied and recovered in any one of the directions of the +X direction and the −X direction.

Figure 8:
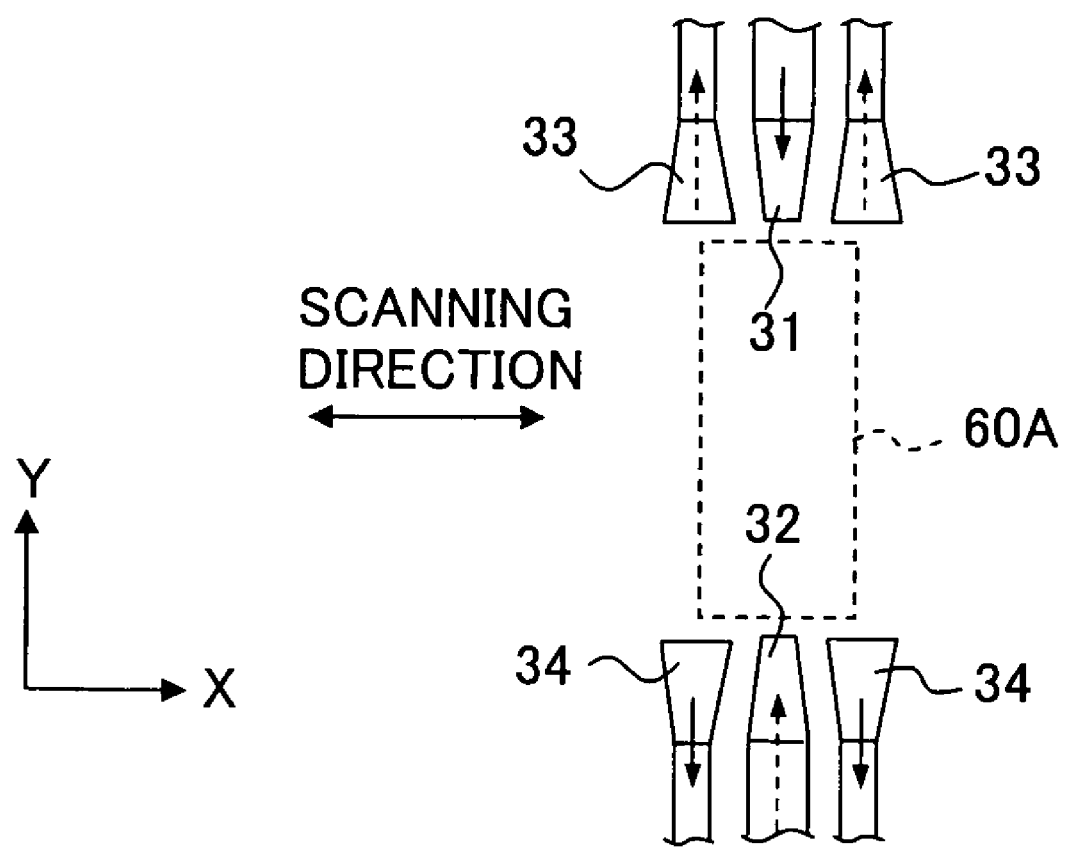
FIG. 8 shows an exemplary arrangement of the supply nozzles and the recovery nozzles.

As shown in FIG. 8, the supply nozzles 31, 32 and the recovery nozzles 33, 34 may be provided on the both sides in the Y axis direction respectively with the end portion 60A intervening therebetween. The supply nozzles and the recovery nozzles can be used to stably supply the liquid 50 to the space between the projection optical system PL and the substrate P as well during the movement of the substrate P in the non-scanning direction (Y axis direction) when the stepping movement is performed.

In the embodiments described above, the liquid, from which the gas has been removed by the gas-removing unit (heating unit 21, pressure-reducing unit 23, membrane degassing unit 24), is supplied to the space 56 between the projection optical system PL and the substrate P without making any contact with the gas. However, if it is confirmed that the gas is sufficiently removed, and the amount of the gas dissolved in the liquid is small, then the liquid may make contact with the gas in a part of or all of the flow passage. That is, the arrangement, in which the liquid is intended to make no contact with the gas between the gas-removing unit and the space 56, is not essential to suppress the gas.

In the embodiments described above, the mechanism is constructed such that the liquid, which is recovered by the liquid recovery unit 2, is returned to the liquid supply unit 1. However, such a mechanism is not necessarily indispensable. It is also allowable that fresh or new pure water is fed to the liquid supply unit 1, and the liquid, which is recovered by the liquid recovery unit 2, is discarded.

In the embodiments described above, the explanation has been made about the case in which the liquid immersion area is formed on the side of the image plane of the projection optical system PL when the substrate P is subjected to the exposure. However, the present invention is not limited only to the case in which the substrate P is subjected to the exposure. In some cases, the liquid is arranged on the side of the image plane of the projection optical system PL to perform various measurements through the liquid as well when various measuring members and measuring sensors provided on the substrate stage PST (Z stage 51) are used. Even when the measurement as described above is performed, it is possible to avoid, for example, any measurement error caused by the bubble, by suppressing the generation of the bubble in the liquid in the same manner as described above.

In the embodiments described above, the liquid supply unit and the liquid recovery unit are constructed such that the supply nozzles and the recovery nozzles are provided on the both sides of the projection area of the projection optical system PL, the liquid is supplied from one side of the projection area and the liquid is recovered on the other side depending on the scanning direction of the substrate P. However, the arrangement of the liquid supply unit and the liquid recovery unit is not limited thereto. It is enough that the liquid can be locally retained between the projection optical system PL and the substrate P.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus.

In the embodiments described above, the exposure apparatus is adopted, in which the space between the projection optical system PL and the substrate P is locally filled with the liquid. However, the present invention is also applicable to a liquid immersion exposure apparatus in which a stage holding a substrate as an exposure objective is moved in a liquid bath, and a liquid immersion exposure apparatus in which a liquid pool having a predetermined depth is formed on a stage and a substrate is held therein. The structure and the exposure operation of the liquid immersion exposure apparatus in which the stage holding the substrate as the exposure objective is moved in the liquid bath are described in detail, for example, in Japanese Patent Application Laid-open No. 6-124873, content of which is incorporated herein by reference within a range of permission of the domestic laws and ordinances of the state designated or selected in this international application. The structure and the exposure operation of the liquid immersion exposure apparatus in which the liquid pool having the predetermined depth is formed on the stage and the substrate is held therein are described in detail, for example, in Japanese Patent Application Laid-open No. 10-303114 and U.S. Pat. No. 5,825,043, contents of which are incorporated herein by reference respectively within a range of permission of the domestic laws and ordinances of the state designated or selected in this international application.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

The present invention is also applicable to a twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference respectively within a range of permission of the domestic laws and ordinances of the state designated or selected in this international application.

As for the type of the exposure apparatus EX, the present invention is not limited to the exposure apparatus for the semiconductor production apparatus for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in Japanese Patent Application Laid-open No. 8-166475 (corresponding to U.S. Pat. No. 5,528,118), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in Japanese Patent Application Laid-open No. 8-330224 (corresponding to U.S. Pat. No. 5,874,820), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 9:
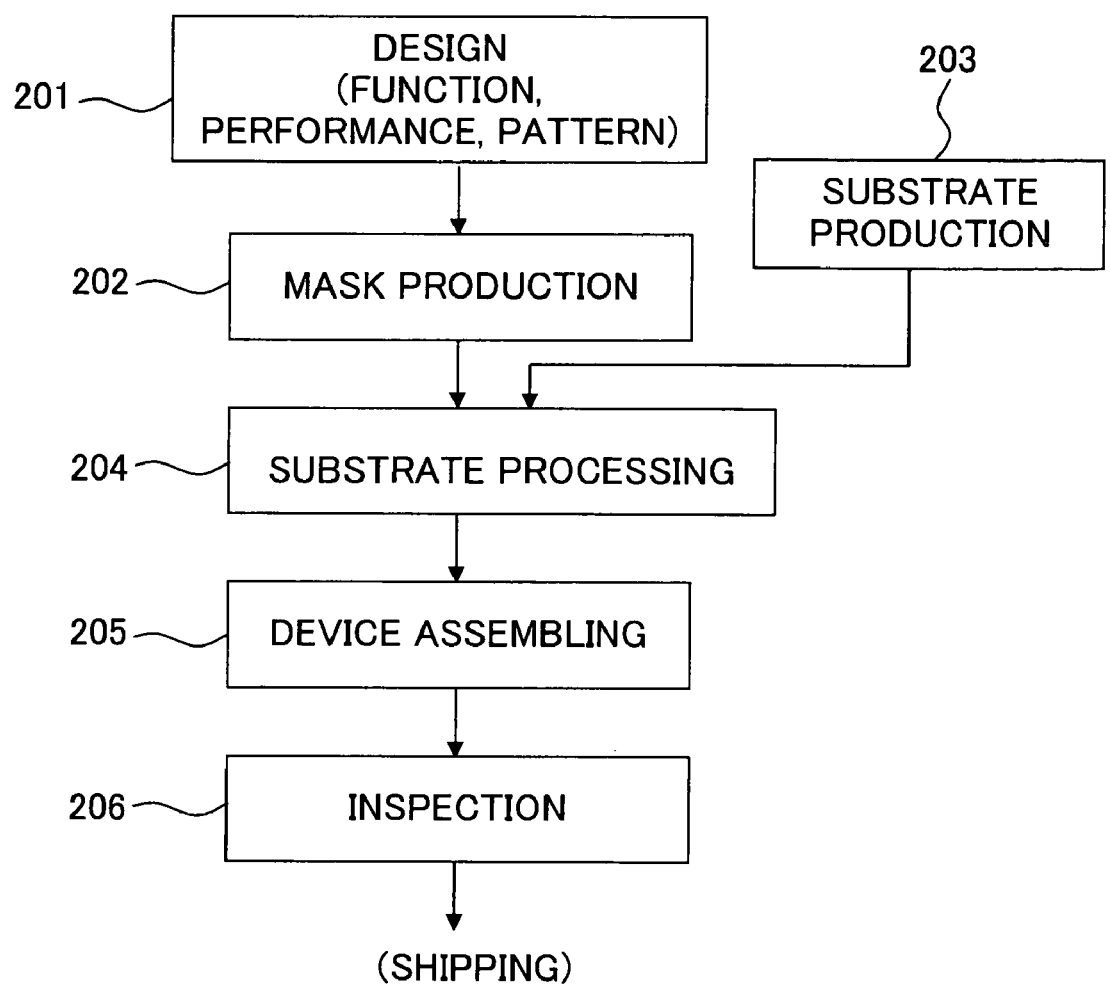
FIG. 9 shows a flow chart illustrating exemplary steps for producing a semiconductor device.

As shown in FIG. 9, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including a dicing step, a bonding step, and a packaging step), and an inspection step 206.

According to the present invention, the bubble-suppressing unit, which suppresses the generation of the bubble in the liquid between the projection optical system and the substrate, is provided. Accordingly, the exposure process can be performed in the state in which no bubble is present in the liquid on the optical path for the exposure light beam. Therefore, it is possible to avoid the deterioration of the pattern image which would be otherwise caused by the bubble. Further, it is possible to produce a device having a high pattern accuracy.

The invention claimed is:

1. An exposure apparatus which exposes a substrate with an image of a predetermined pattern, the exposure apparatus comprising:
   a projection optical system which projects the image of the predetermined pattern onto a surface of the substrate;
   a liquid supply unit which supplies a liquid to a space between the projection optical system and the substrate to form an immersion area on the surface of the substrate onto which the image of the predetermined pattern is projected, the immersion area having a size that is smaller than a size of the surface of the substrate such that only a portion of the surface of the substrate onto which the predetermined pattern is projected is covered by the liquid, the liquid supply unit causing the liquid to flow through the immersion area while the predetermined pattern is being projected onto the surface of the substrate; and
   a gas-removing unit which removes a gas component dissolved in the liquid which is to be supplied to the space between the projection optical system and the substrate so that bubbles are not generated in the space when at least one of temperature of the liquid and pressure exerted on the liquid in the space is changed during exposure.

2. The exposure apparatus according to claim 1, wherein the gas-removing unit removes the gas component from the liquid so that an air concentration in the liquid is not more than $0.016 \text{ cm}^3/\text{cm}^3$.

3. The exposure apparatus according to claim 1, wherein the gas-removing unit is at least one of a heating unit, a pressure-reducing unit, and a degassing membrane.

4. The exposure apparatus according to claim 1, wherein the liquid supply unit includes a plurality of supply nozzles which supply the liquid to the space between the projection optical system and the substrate, and a plurality of recovery nozzles which recover the liquid supplied to the space between the projection optical system and the substrate.

5. The exposure apparatus according to claim 4, wherein the exposure apparatus further comprises a stage which is movable while placing the substrate thereon, the exposure is performed during a period in which the stage moves the substrate with respect to the image projected from the projection optical system, and the supply nozzles jet the liquid in a direction of movement of the substrate.

6. The exposure apparatus according to claim 4, wherein the supply nozzles and the recovery nozzles are alternately arranged.

7. The exposure apparatus according to claim 6, wherein combinations of the supply nozzles and the recovery nozzles arranged alternately are opposed to one another with a projection area of the projection optical system intervening therebetween.

8. The exposure apparatus according to claim 1, further comprising a temperature-adjusting unit which adjusts a temperature of the liquid supplied from the liquid supply unit.

9. The exposure apparatus according to claim 8, wherein the temperature-adjusting unit adjusts the temperature of the liquid so that the temperature of the liquid is a temperature in the exposure apparatus.

10. The exposure apparatus according to claim 9, wherein a temperature of the substrate is controlled by supplying the temperature-adjusted liquid to the space between the projection optical system and the substrate.

11. An exposure apparatus which exposes a substrate by projecting an image of a pattern onto a surface of the substrate with a projection optical system, the exposure apparatus comprising:
a liquid supply unit which fills, with a liquid, at least a part of a space between the projection optical system and the substrate to form an immersion area on the surface of the substrate onto which the image of the pattern is projected, the immersion area having a size that is smaller than a size of the surface of the substrate such that only a portion of the surface of the substrate onto which the pattern is projected is covered by the liquid, the liquid supply unit causing the liquid to flow through the immersion area while the pattern is being projected onto the surface of the substrate; and
a bubble-suppressing unit which is provided on a flow passage of the liquid which is to be supplied to the space between the projection optical system and the substrate, and which suppresses generation of any bubble in the liquid,
wherein the bubble-suppressing unit includes a degassing unit which removes gas from the liquid over a degassing level so that the bubble is not generated in the space by change in at least one of temperature of the liquid and pressure exerted on the liquid between the projection optical system and the substrate during exposure.

12. The exposure apparatus according to claim 11, wherein the degassing unit includes a heating unit which heats the liquid.

13. The exposure apparatus according to claim 12, wherein the heating unit sets a temperature T of the liquid to be 30° C.<T≦100° C.

14. The exposure apparatus according to claim 11, wherein the degassing unit includes a pressure-reducing unit which reduces a pressure in a unit in which the liquid is retained.

15. The exposure apparatus according to claim 14, wherein the pressure-reducing unit sets the pressure depending on a temperature of the liquid.

16. The exposure apparatus according to claim 11, wherein the degassing unit determines the degassing level so that the bubble is not generated by any change in the temperature of at least a part of the liquid disposed between the projection optical system and the substrate.

17. The exposure apparatus according to claim 11, wherein the degassing unit determines the degassing level so that the bubble is not generated by any change in the pressure exerted on the liquid between the projection optical system and the substrate.

18. The exposure apparatus according to claim 11, wherein the degassing unit is a membrane degassing unit.

19. The exposure apparatus according to claim 18, wherein the membrane degassing unit includes a hollow fiber member.

20. The exposure apparatus according to claim 19, wherein the hollow fiber member is gas-permeable and liquid-impermeable.

21. The exposure apparatus according to claim 18, further comprising a heating unit which heats the liquid which is to be supplied to the membrane degassing unit to decrease a concentration of dissolved gas in the liquid which is to be supplied to the membrane degassing unit.

22. The exposure apparatus according to claim 11, wherein the liquid, for which the generation of the bubble has been suppressed by the bubble-suppressing unit, is supplied to the space between the projection optical system and the substrate without making a contact with gas.

23. The exposure apparatus according to claim 11, wherein the liquid supply unit includes a filter unit which filters the liquid which is to be supplied to the space between the projection optical system and the substrate.

24. The exposure apparatus according to claim 23, wherein the liquid supply unit further includes a temperature-adjusting unit which adjusts a temperature of the liquid having been degassed by the degassing unit.

25. The exposure apparatus according to claim 11, wherein the liquid supply unit further includes a temperature-adjusting unit which adjusts a temperature of the liquid having been degassed by the degassing unit.

26. A method for producing a device comprising:
exposing a substrate using the exposure apparatus as defined in claim 1; and
processing the exposed substrate to produce the device.

27. A method for producing a device comprising:
exposing a substrate using the exposure apparatus as defined in claim 11; and
processing the exposed substrate to produce the device.

28. The exposure apparatus according to claim 1, wherein the gas-removing unit removes the gas component dissolved in the liquid.

29. The exposure apparatus according to claim 28, wherein the gas-removing unit includes a degassing system.

30. The exposure apparatus according to claim 29, further comprising a temperature-adjusting unit which adjusts the temperature of the liquid degassed by the degassing system.

31. The exposure apparatus according to claim 29, further comprising a filter unit which filters the liquid before degassing the liquid by the degassing system.

32. The exposure apparatus according to claim 28, further comprising a liquid recovery unit which recovers the liquid on the substrate and returns the recovered liquid to the liquid supply unit.

33. The exposure apparatus according to claim 1, further comprising a liquid recovery unit which recovers the liquid on the substrate and returns the recovered liquid to the liquid supply unit.

34. The exposure apparatus according to claim 11, wherein the bubble-suppressing unit removes the gas component dissolved in the liquid.

35. The exposure apparatus according to claim 11, further comprising a filter unit which filters the liquid before degassing the liquid by the degassing unit.

36. The exposure apparatus according to claim 34, further comprising a liquid recovery unit which recovers the liquid on the substrate and returns the recovered liquid to the liquid supply unit.

37. The exposure apparatus according to claim 11, further comprising a liquid recovery unit which recovers the liquid on the substrate and returns the recovered liquid to the liquid supply unit.

38. An exposure method for exposing a substrate by projecting a pattern image onto a surface of the substrate, comprising:
supplying a liquid to an exposure apparatus;
producing a degassed liquid by removing a gas component dissolved in the liquid supplied to the exposure apparatus;
supplying the degassed liquid onto the substrate to form an immersion area on the surface of the substrate onto which the pattern image is projected, the immersion area having a size that is smaller than a size of the surface of the substrate such that only a portion of the surface of the substrate onto which the pattern image is projected is covered by the liquid; and
exposing the substrate through the degassed liquid while the degassed liquid is caused to flow through the immersion area,
wherein the degassed liquid is produced by removing the gas component so that bubbles are not generated in the immersion area when at least one of temperature of the liquid and pressure exerted on the liquid in the space is changed during exposure.

39. The exposure method according to claim 38, further comprising:
adjusting the temperature of the degassed liquid.

40. The exposure method according to claim 38, further comprising:
filtering the liquid before removing the gas component from the liquid.

41. The exposure method according to claim 38, wherein the gas component is removed by using a membrane.

42. A method for producing a device comprising:
exposing a substrate by using the exposure method as defined in claim 38; and
processing the exposed substrate to produce the device.

43. The exposure apparatus according to claim 1, further comprising:
a stage which is movable relative to the projection optical system; and
a measuring member provided at the stage, wherein the liquid from which the gas component is removed is supplied to a space between the projection optical system and the measuring member.

44. The exposure apparatus according to claim 1, further comprising:
a stage which is movable relative to the projection optical system; and
a sensor provided at the stage, wherein the liquid from which the gas component is removed is supplied to a space between the projection optical system and the sensor.

45. The exposure apparatus according to claim 28, wherein the gas component includes oxygen.

46. The exposure apparatus according to claim 28, wherein the gas component includes nitrogen.

47. The exposure apparatus according to claim 29, wherein the degassing system includes a membrane degassing unit.

48. The exposure apparatus according to claim 47, wherein the membrane degassing unit includes a gas-permeable and liquid-impermeable member.

49. The exposure apparatus according to claim 11, further comprising:
a stage which is movable relative to the projection optical system; and
a measuring member provided at the stage, wherein the liquid in which generation of bubbles has been suppressed is supplied to a space between the projection optical system and the measuring member.

50. The exposure apparatus according to claim 11, further comprising:
a stage which is movable relative to the projection optical system; and
a sensor provided at the stage, wherein the liquid in which generation of bubbles has been suppressed is supplied to a space between the projection optical system and the sensor.

51. The exposure apparatus according to claim 34, wherein the gas component includes oxygen.

52. The exposure apparatus according to claim 34, wherein the gas component includes nitrogen.

53. The exposure apparatus according to claim 34, wherein the degassing unit includes a membrane degassing unit.

54. The exposure apparatus according to claim 53, wherein the membrane degassing unit includes a gas-permeable and liquid-impermeable member.

55. An exposure apparatus which exposes a substrate by projecting an image of a pattern onto a surface of the substrate with a projection optical system, the exposure apparatus comprising:
a liquid supply unit which fills, with a liquid, at least a part of a space between the projection optical system and the substrate to form an immersion area on the surface of the substrate onto which the image of the pattern is projected, the immersion area having a size that is smaller than a size of the surface of the substrate such that only a portion of the surface of the substrate onto which the pattern is projected is covered by the liquid, the liquid supply unit causing the liquid to flow through the immersion area while the pattern is being projected onto the surface of the substrate; and
a bubble-suppressing unit which is provided on a flow passage of the liquid which is to be supplied to the space between the projection optical system and the substrate, and which suppresses generation of any bubble in the liquid,
wherein the bubble-suppressing unit includes a degassing unit which removes gas from the liquid over a degassing level so that the bubble is not generated in the space during exposure, the degassing unit includes a pressure-reducing unit which reduces a pressure in a unit in which the liquid is retained, and the pressure-reducing unit sets the pressure depending on a temperature of the liquid.

56. An exposure apparatus which exposes a substrate by projecting an image of a pattern onto a surface of the substrate with a projection optical system, the exposure apparatus comprising:
a liquid supply unit which fills, with a liquid, at least a part of a space between the projection optical system and the substrate to form an immersion area on the surface of the substrate onto which the image of the pattern is projected, the immersion area having a size that is smaller than a size of the surface of the substrate such that only a portion of the surface of the substrate onto which the pattern is projected is covered by the liquid, the liquid supply unit causing the liquid to flow through the immersion area while the pattern is being projected onto the surface of the substrate;
a bubble-suppressing unit which is provided on a flow passage of the liquid which is to be supplied to the space between the projection optical system and the substrate, and which suppresses generation of any bubble in the liquid, wherein the bubble-suppressing unit includes a degassing unit which removes gas from the liquid over a degassing level so that the bubble is not generated in the space during exposure, the degassing unit is a membrane degassing unit; and a heating unit which heats the liquid which is to be supplied to the membrane degassing unit to decrease a concentration of dissolved gas in the liquid which is to be supplied to the membrane degassing unit.

* * * * *